(12) United States Patent
Murugan et al.

(10) Patent No.: US 11,990,499 B2
(45) Date of Patent: May 21, 2024

(54) DISPLAY APPARATUS AND METHOD OF FABRICATING THE SAME

(71) Applicant: PlayNitride Display Co., Ltd., MiaoLi County (TW)

(72) Inventors: Loganathan Murugan, MiaoLi County (TW); Sheng-Yuan Sun, MiaoLi County (TW); Chun-Ming Tseng, MiaoLi County (TW); Yi-Chun Shih, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 601 days.

(21) Appl. No.: 17/184,609

(22) Filed: Feb. 25, 2021

(65) Prior Publication Data

US 2022/0059607 A1 Feb. 24, 2022

Related U.S. Application Data

(60) Provisional application No. 63/069,693, filed on Aug. 24, 2020.

(30) Foreign Application Priority Data

Jan. 20, 2021 (TW) ................................. 110102043

(51) Int. Cl.
*H01L 27/15* (2006.01)
*H01L 25/075* (2006.01)
(Continued)

(52) U.S. Cl.
CPC .......... *H01L 27/156* (2013.01); *H01L 33/005* (2013.01); *H01L 33/486* (2013.01);
(Continued)

(58) Field of Classification Search
CPC ..... H01L 33/486; H01L 33/58; H01L 25/167; H01L 25/0753
See application file for complete search history.

(56) References Cited

U.S. PATENT DOCUMENTS

2019/0327827 A1  10/2019  Chang et al.
2020/0126475 A1  4/2020  Ting et al.
(Continued)

FOREIGN PATENT DOCUMENTS

CN  108573992  9/2018
CN  110033709  7/2019
(Continued)

OTHER PUBLICATIONS

"Office Action of China Counterpart Application", dated Jul. 26, 2022, p. 1-p. 11.
(Continued)

*Primary Examiner* — Antonio B Crite
(74) *Attorney, Agent, or Firm* — JCIPRNET

(57) ABSTRACT

A display apparatus including at least one driving circuit board, a plurality of light-emitting units, and a light-shielding layer is provided. The light-emitting units are disposed on a surface of the at least one driving circuit board and respectively have a plurality of pixel areas. The light-shielding layer is disposed on the at least one driving circuit board and disposed between the light-emitting units. The light-emitting units each have a circuit layer and a plurality of micro light-emitting devices. The circuit layer is electrically bonded to one of the at least one driving circuit board. The plurality of micro light-emitting devices are disposed on a side of the circuit layer away from the at least one driving circuit board and electrically bonded to the circuit layer. The micro light-emitting devices are respectively located in the pixel areas. A method of fabricating the display apparatus is also provided.

17 Claims, 20 Drawing Sheets

(51) Int. Cl.
*H01L 25/16* (2023.01)
*H01L 33/00* (2010.01)
*H01L 33/44* (2010.01)
*H01L 33/48* (2010.01)
*H01L 33/54* (2010.01)
*H01L 33/58* (2010.01)
*H01L 33/62* (2010.01)

(52) U.S. Cl.
CPC ............. *H01L 33/54* (2013.01); *H01L 33/58* (2013.01); *H01L 33/62* (2013.01); *H01L 2933/0066* (2013.01)

(56) References Cited

U.S. PATENT DOCUMENTS

2020/0144465 A1   5/2020   Lee
2021/0135070 A1*  5/2021   Rinne ................... H01L 33/56

FOREIGN PATENT DOCUMENTS

| CN | 110379322 | 10/2019 | | |
| CN | 110504383 A | * 11/2019 | ........... | H01L 27/322 |
| CN | 110838500 | 2/2020 | | |
| CN | 110875346 | 3/2020 | | |
| CN | 111081694 | 4/2020 | | |
| CN | 210666266 | 6/2020 | | |
| CN | 111430403 | 7/2020 | | |
| TW | 201814880 | 4/2018 | | |
| TW | 201938173 | 10/2019 | | |
| TW | 201947757 | 12/2019 | | |
| WO | 2019001029 | 1/2019 | | |
| WO | 2019026858 | 2/2019 | | |
| WO | 2019225708 | 11/2019 | | |

OTHER PUBLICATIONS

"Office Action of Taiwan Counterpart Application", dated Sep. 14, 2021, p. 1-p. 4.

* cited by examiner

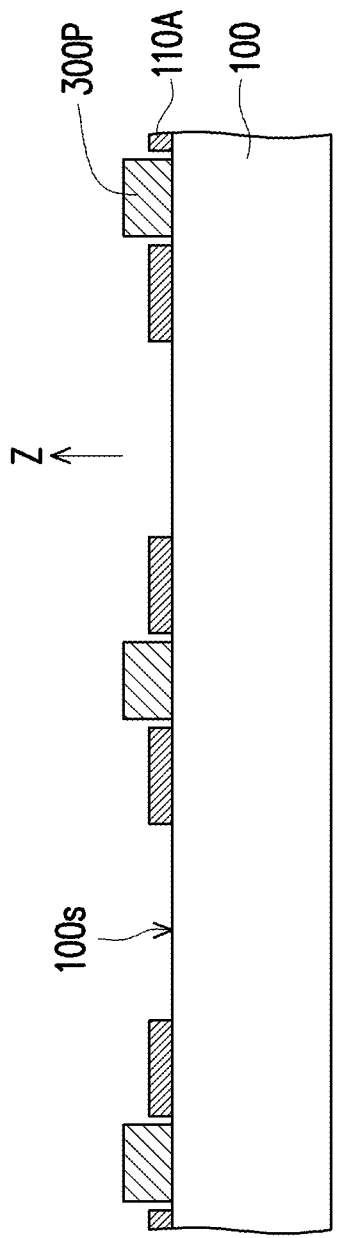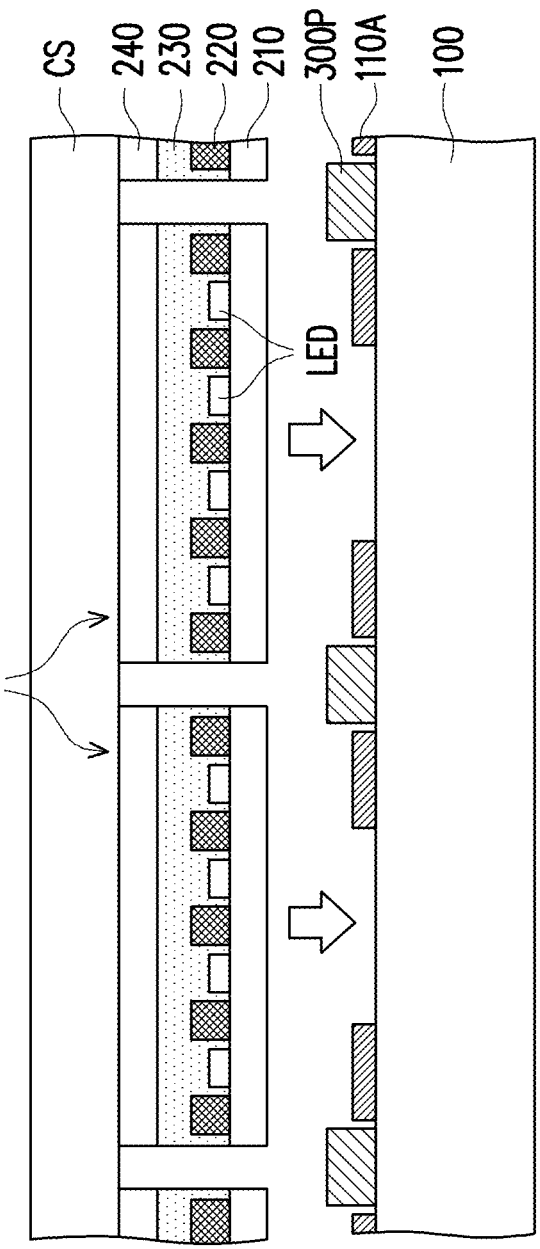

DISPLAY APPARATUS AND METHOD OF FABRICATING THE SAME

CROSS-REFERENCE TO RELATED APPLICATION

This application claims the priority benefits of U.S. provisional application Ser. No. 63/069,693, filed on Aug. 24, 2020. This application also claims the priority benefit of Taiwan application serial no. 110102043, filed on Jan. 20, 2021. The entirety of each of the above-mentioned patent applications is hereby incorporated by reference herein and made a part of this specification.

BACKGROUND OF THE INVENTION

Field of the Invention

The invention relates to an electronic apparatus and a method of fabricating the same, and more particularly, to a display apparatus and a method of fabricating the same.

Description of Related Art

In recent years, the manufacturing cost of an organic light-emitting diode (OLED) display panel has been high and the service life thereof does not compare with current mainstream displays, and therefore a micro light-emitting diode display (micro LED display) has gradually attracted investment from various technical companies. The micro light-emitting diode display has optical performance equivalent to that of organic light-emitting diode display techniques, such as high color saturation, fast response speed, and high contrast, and has the advantages of low energy consumption and long material life. Generally speaking, the fabrication technique of the micro light-emitting diode display adopts the method of die transposition to directly transfer prefabricated micro light-emitting diode dies onto a driving circuit backplate.

Although such mass transfer technique has its development advantages in the fabrication of large-size products, the improvement of production yield is an important indicator of current related process techniques and equipment development, wherein a secondary transfer technique of chips is proposed. For example, the dies needed by the micro light-emitting diode display are first transposed (transferred and disposed) on a plurality of intermediate substrates to form a plurality of light-emitting units. Then, the light-emitting units are transferred onto a target circuit board to complete the micro light-emitting diode display. However, gaps may be formed between the light emitting units due to an extremely high precision of aligning the light-emitting units during the transposing process is unavailable. The gaps form a visual discontinuity in the display screen of the micro light-emitting diode display.

SUMMARY OF THE INVENTION

The invention provides a display apparatus with better display quality.

The invention provides a method of fabricating a display apparatus, wherein the fabricating process of the light-shielding layer is more flexible.

A display apparatus of the invention includes at least one driving circuit board, a plurality of light-emitting units, and a light-shielding layer. The light-emitting units are disposed on a surface of the at least one driving circuit board and respectively have a plurality of pixel areas. The light-shielding layer is disposed on the at least one driving circuit board and disposed between the light-emitting units. The light-emitting units each have a circuit layer and a plurality of micro light-emitting devices. The circuit layer is electrically bonded to one of the at least one driving circuit board. The plurality of micro light-emitting devices are disposed on a side of the circuit layer away from the at least one driving circuit board and electrically bonded to the circuit layer. The micro light-emitting devices are respectively located in the pixel areas.

In an embodiment of the invention, an optical density of the light-shielding layer of the display apparatus is greater than 2.

In an embodiment of the invention, each of the plurality of light-emitting units of the display apparatus further includes a light-blocking layer disposed on the circuit layer and having a plurality of openings. The plurality of micro light-emitting devices are respectively disposed in the openings.

In an embodiment of the invention, an optical density of the light-blocking layer of the display apparatus is greater than or equal to an optical density of the light-shielding layer.

In an embodiment of the invention, the light-shielding layer and the light-blocking layer of the display apparatus are made of a same material.

In an embodiment of the invention, the light-shielding layer and the light-blocking layer of the display apparatus respectively have a first top surface and a second top surface away from at least one driving circuit board. The first top surface and the second top surface respectively have a first height and a second height relative to a surface of the at least one driving circuit board, and the first height is greater than the second height.

In an embodiment of the invention, a ratio of a first distance between a first top surface of the light-shielding layer away from at least one driving circuit board and the surface of the at least one driving circuit board to a second distance between a surface of the circuit layer away from the at least one driving circuit board and the surface of the at least one driving circuit board is between 0.9 and 1.1.

In an embodiment of the invention, the display apparatus further includes a protective layer and a cover plate. The protective layer covers the plurality of light-emitting units and the light-shielding layer. The cover plate is disposed on the protective layer and overlapped with the light-emitting units and the light-shielding layer.

In an embodiment of the invention, a Young's modulus of the light-shielding layer of the display apparatus is less than a Young's modulus of the protective layer, and the Young's modulus of the protective layer is less than a Young's modulus of the cover plate.

In an embodiment of the invention, each of the plurality of light-emitting units of the display apparatus further includes a color-mixing layer and an adhesive layer. The color-mixing layer is disposed on a side of the plurality of micro light-emitting devices away from the circuit layer. The adhesive layer is disposed between the circuit layer and the color-mixing layer.

In an embodiment of the invention, a refractive index difference of the protective layer, the color-mixing layer, and the adhesive layer is less than or equal to 1 and greater than or equal to 0.

In an embodiment of the invention, the display apparatus further includes a light-guiding layer sandwiched between the plurality of light-emitting units and disposed on the light-shielding layer.

In an embodiment of the invention, a transmittance of the light-guiding layer of the display apparatus is less than a transmittance of the protective layer.

In an embodiment of the invention, an optical structure is provided on a top surface of the light-shielding layer of the display apparatus away from the at least one driving circuit board.

In an embodiment of the invention, the light-shielding layer of the display apparatus further extends between the circuit layer of each of the light-emitting units and the at least one driving circuit board.

In an embodiment of the invention, the display apparatus further includes a light-absorbing layer. The at least one driving circuit board includes a first driving circuit board and a second driving circuit board. The light-absorbing layer is disposed between the first driving circuit board and the second driving circuit board, and an optical density of the light-absorbing layer is less than or equal to an optical density of the light-blocking layer.

In an embodiment of the invention, the light-shielding layer of the display apparatus has elasticity.

In an embodiment of the invention, the light-shielding layer of the display apparatus has conductivity, and the circuit layer of each of the light-emitting units is electrically connected to the at least one driving circuit board via the light-shielding layer.

A method of fabricating a display apparatus of the invention includes providing a driving circuit board, performing a transferring step to transfer and electrically bond a plurality of light-emitting units onto a plurality of conductive bumps of the driving circuit board, and forming a light-shielding layer on the driving circuit board. The light-emitting units each have a circuit layer and a plurality of micro light-emitting devices. The conductive bumps are dispersedly arranged on a surface of the driving circuit board. The circuit layer is electrically bonded to the conductive bumps. The micro light-emitting devices are disposed on a side of the circuit layer away from the driving circuit board and electrically bonded to the circuit layer. The light-shielding layer is disposed between the light-emitting units.

In an embodiment of the invention, the step of forming the light-shielding layer of the method of fabricating the display apparatus includes forming a light-shielding material layer on the driving circuit board before the transferring step of the plurality of light-emitting units is performed and performing a curing step to form the light-shielding layer. During the transferring process of the light-emitting units, the light-shielding material layer is compressed by the light-emitting units to fill a gap between the light-emitting units.

In an embodiment of the invention, the step of forming the light-shielding layer of the method of fabricating the display apparatus includes forming a light-shielding material layer on the driving circuit board after the transferring step of the plurality of light-emitting units is completed and performing a lithography step on the light-shielding material layer to form the light-shielding layer. The light-shielding material layer covers the light-emitting units and a portion of the surface of the driving circuit board.

Based on the above, in the display apparatus of an embodiment of the invention, a light-shielding layer is provided in the gaps between the plurality of light-emitting units electrically bonded to the at least one circuit board. The light-shielding layer is suitable for absorbing at least a portion of the light incident on the gaps, thereby improving the visibility and the consistency of the gaps under the illumination of external ambient light. In other words, the visual discontinuity caused by the gaps to the display images of the light-emitting units may be effectively alleviated, thereby improving the display quality of the display apparatus. In the method of fabricating the display apparatus of an embodiment of the invention, the step of forming the light-shielding layer may start before or after the transferring step of the plurality of light-emitting units, thus increasing the flexibility of the fabricating process of the light-shielding layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A to FIG. 4C are cross-sectional views of the fabricating process of a display apparatus of another embodiment of the invention.

DESCRIPTION OF THE EMBODIMENTS

Figure 1:
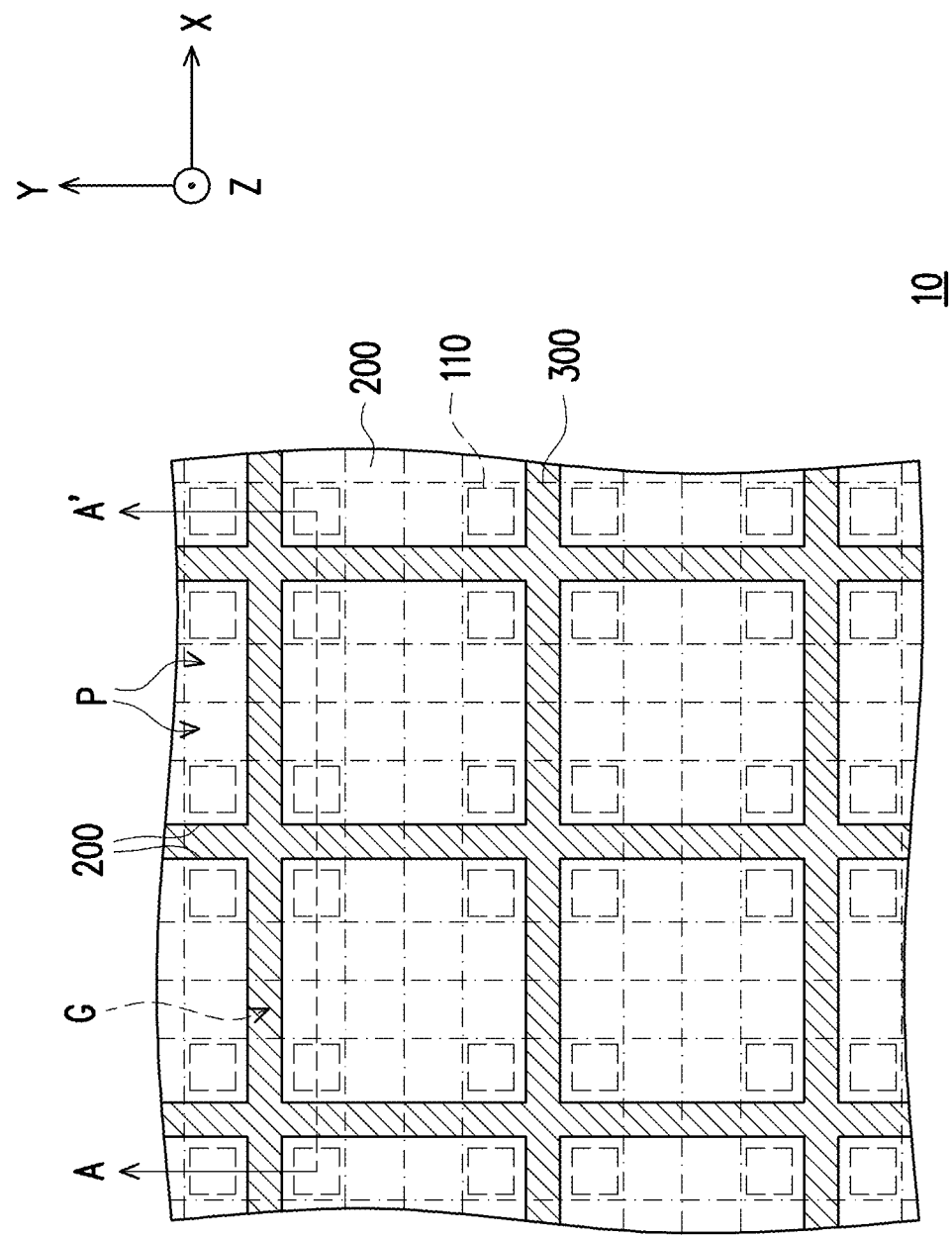
FIG. 1 is a top view of a display apparatus of the first embodiment of the invention.

In the figures, for clarity, the thicknesses of, for example, layers, films, panels, and regions are enlarged. It should be understood that, when a layer, film, region, or a device of a substrate is "on" another device or "connected to" another device, the device may be directly on the other device or connected to the other device, or an intermediate device may also be present. On the other hand, when a device is "directly on another device" or "directly connected to" another device, an intermediate device is not present. As used in the present specification, "connected to" may refer to a physical and/or electrical connection. Furthermore, "electrically connected" may mean that other devices are present between two devices.

Hereinafter, exemplary embodiments of the invention are described in detail, and examples of the exemplary embodiments are conveyed via the figures. Wherever possible, the same reference numerals are used in the figures and the descriptions to refer to the same or similar portions.

Figure 2:
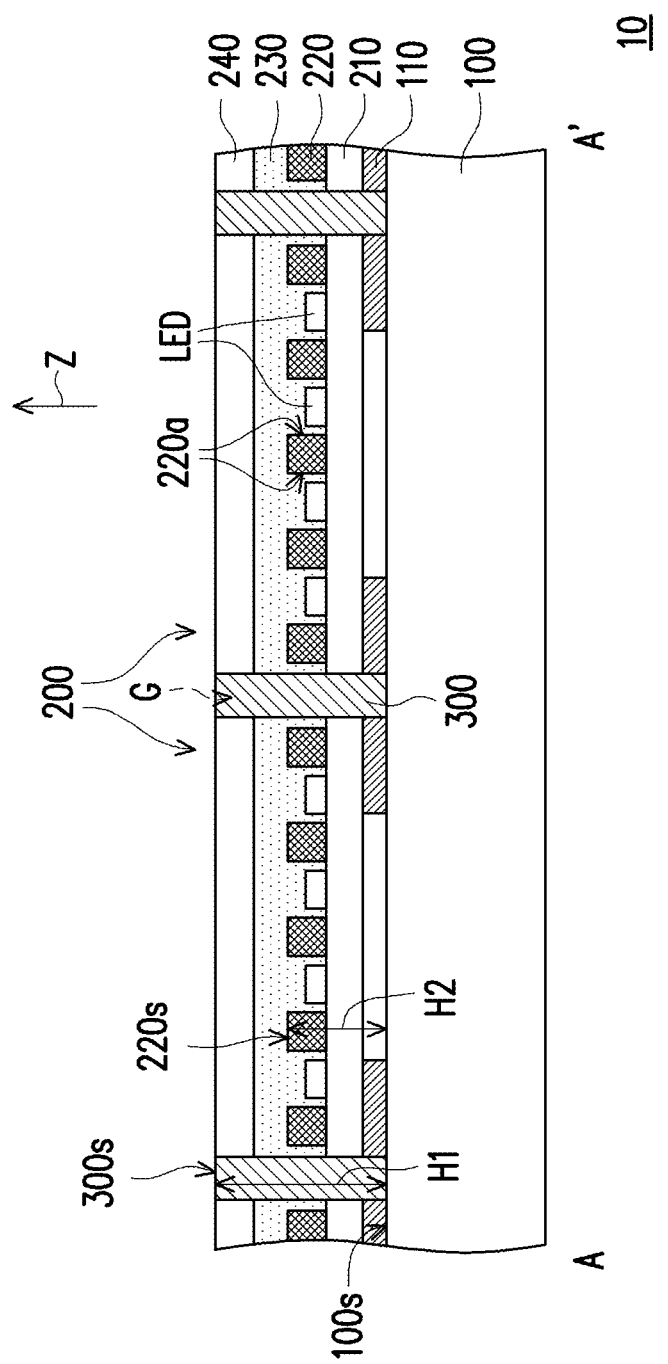
FIG. 2 is a cross-sectional view of the display apparatus of FIG. 1.
Figure 3A:
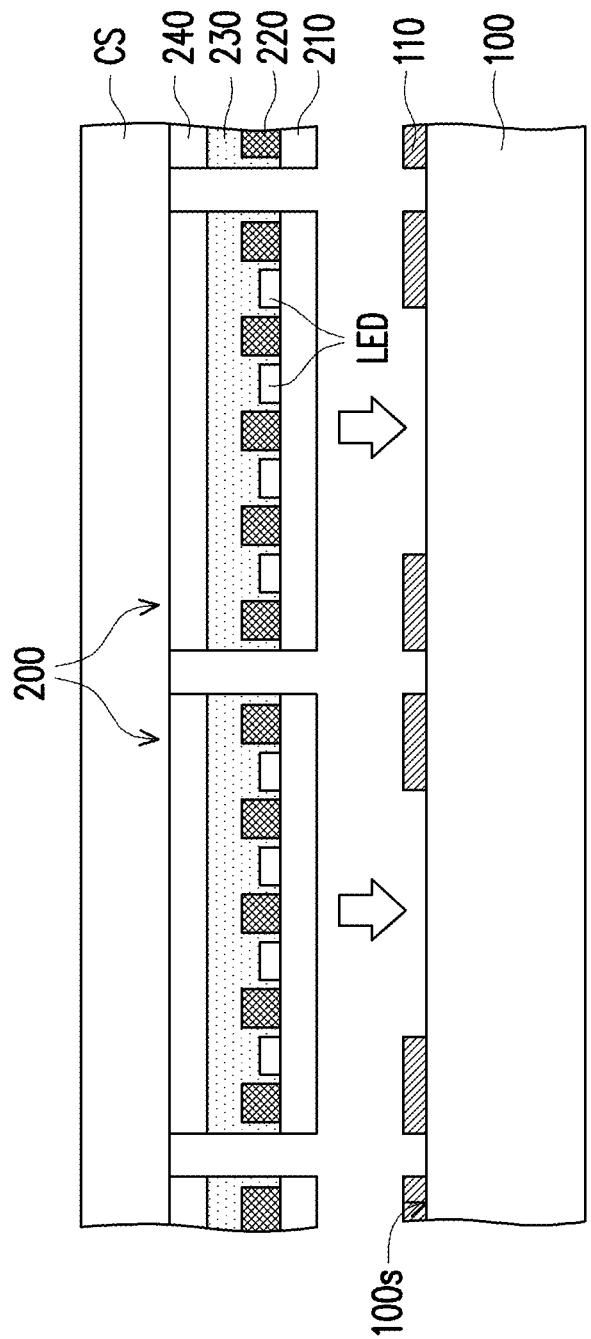
FIG. 3A to FIG. 3C are cross-sectional views of the fabricating process of the display apparatus of FIG. 2.
Figure 3B:
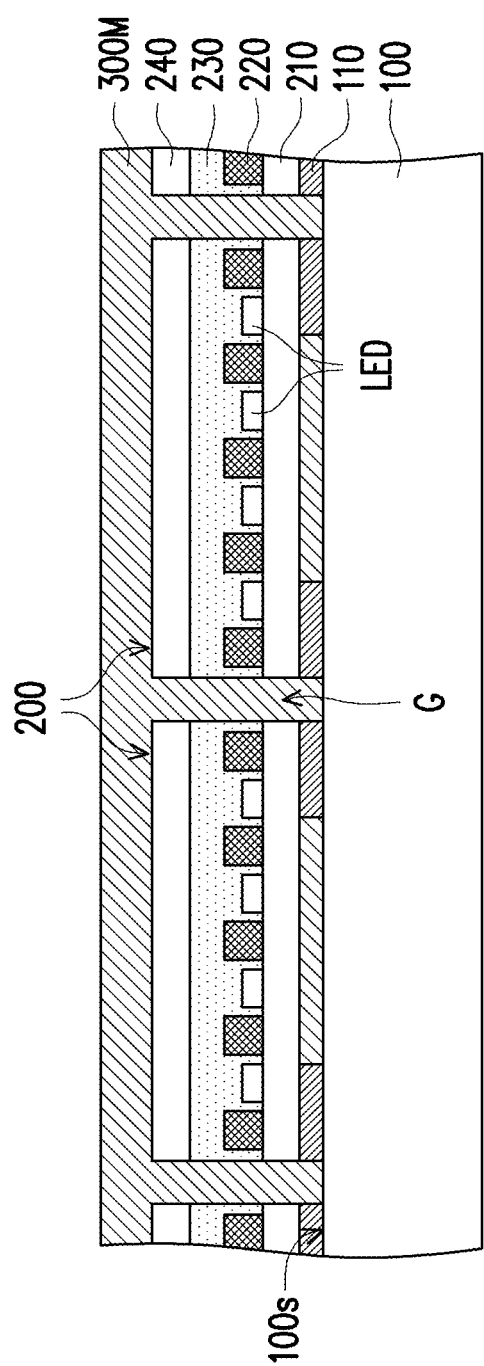
Figure 3C:
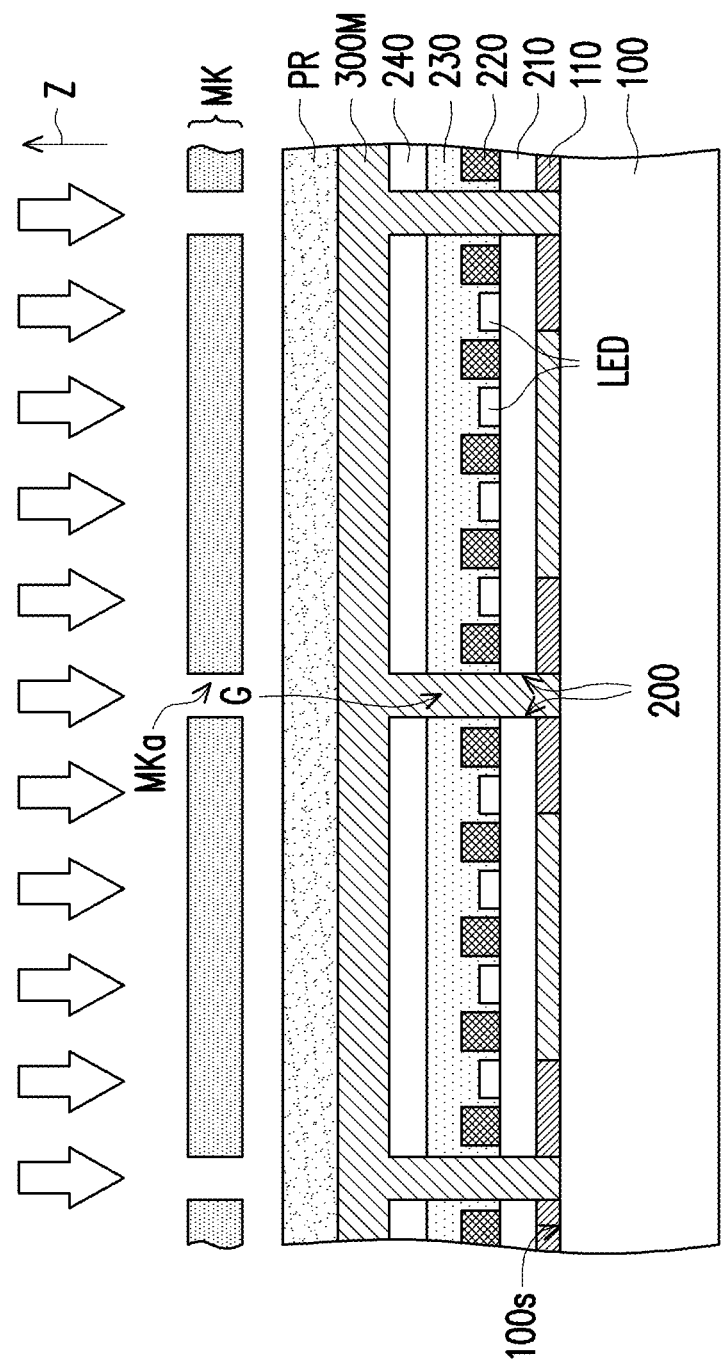
Figure 4C:
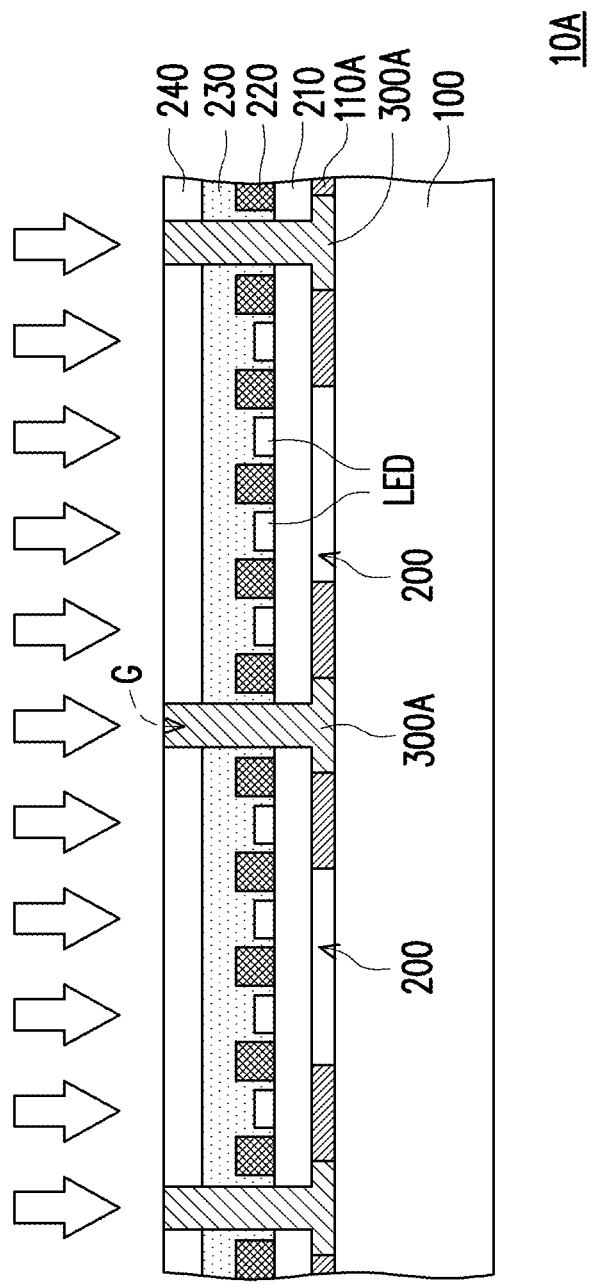

FIG. 1 is a top view of a display apparatus of the first embodiment of the invention. FIG. 2 is a cross-sectional view of the display apparatus of FIG. 1. FIG. 2 corresponds to section line A-A' of FIG. 1. FIG. 3A to FIG. 3C are cross-sectional views of the fabricating process of the display apparatus of FIG. 2. FIG. 4A to FIG. 4C are cross-sectional views of the fabricating process of the display apparatus of another embodiment of the invention. Referring to FIG. 1 and FIG. 2, a display apparatus 10 includes a driving circuit board 100 and a plurality of light-emitting units 200. The light-emitting units 200 are disposed on a surface 100s of the driving circuit board 100, and each has a plurality of pixel areas P. For example, the light-emitting units 200 may be arranged in a plurality of rows and a plurality of columns in a direction X and a direction Y, respectively. A plurality of conductive bumps 110 corresponding to the light-emitting units 200 are dispersedly arranged on the surface 100s of the driving circuit board 100, and the light-emitting units 200 are respectively bonded to the conductive bumps 110 to be electrically connected to the driving circuit board 100. It should be mentioned that, in the present embodiment, the number of the conductive bumps 110 corresponding to each of the light-emitting units 200 is exemplified by four, and the invention is limited by the content of the figures. In other embodiments, the number of the conductive bumps 110 corresponding to each of the light-emitting units 200 on the driving circuit board 100 may be adjusted based on the actual design of the light-emitting units 200 (for example, the number of micro light-emitting devices LED, the number of the pixel areas P, the circuit design of a circuit layer 210, etc.)

The light-emitting units 200 include the circuit layer 210 and a plurality of micro light-emitting devices LED. A side of the circuit layer 210 is electrically connected to the driving circuit board 100, and the micro light-emitting devices LED are disposed on another side of the circuit layer 210 away from the driving circuit board 100 and are independently controlled by the driving circuit board 100 and the circuit layer 210. More specifically, the display apparatus 10 achieves a display effect via the plurality of light-emitting units 200 tiled with each other, and the light-emitting intensity of the plurality of micro light-emitting devices LED on the light-emitting units 200 may be individually controlled by the driving circuit board 100 according to the image screen to be presented.

For example, the circuit layer 210 may include a plurality of metal layers (not shown) and a plurality of insulating layers (not shown) stacked alternately. One of the metal layers is used to form a plurality of conductive patterns on a side of the circuit layer 210, wherein another is used to form a plurality of pad patterns not on another side of the circuit layer 210, and yet another is used to form a plurality of transfer patterns. The transfer patterns may respectively be electrically connected to the conductive patterns and the pad patterns via a plurality of contact holes of the insulating layers. That is, the metal layers may form a plurality of conductive paths electrically insulated from each other between two opposite sides of the circuit layer 210. The plurality of micro light-emitting devices LED connected to the conductive patterns located on a side of the circuit layer 210 may be electrically connected to the pad patterns located on another side of the circuit layer 210 via the conductive paths, respectively. The light-emitting units 200 may be electrically bonded to the conductive bumps 110 of the driving circuit board 100 via the pad patterns.

In the present embodiment, the light-emitting units 200 may also optionally include a light-blocking layer 220, an adhesive layer 230, and a color-mixing layer 240. The light-blocking layer 220 is disposed on a side of the circuit layer 210 provided with the micro light-emitting devices LED. The light-blocking layer 220 has a plurality of openings 220a, and the plurality of micro light-emitting devices LED of the light-emitting units 200 are respectively disposed in the openings 220a of the light-blocking layer 220. More specifically, the openings 220a of the light-blocking layer 220 may define the plurality of pixel areas P of the light-emitting units 200 (or the display apparatus 10), and the pixel areas P are arranged in an array along the direction X and the direction Y, respectively. For example, in the present embodiment, the number of the micro light-emitting devices LED in each of the pixel areas P is three, and the micro light-emitting devices LED are respectively configured to emit red light, green light, and blue light, but are not limited thereto. In other embodiments, the number of the micro light-emitting devices LED disposed in each of the pixel areas P may be adjusted according to different optical designs (for example, the type of light-emitting color of the micro light-emitting devices LED) or product specifications (for example, light output brightness).

In order to prevent the light emitted by the micro light-emitting devices LED in each of the pixel areas P from emitting from the adjacent pixel area P and causing a decrease in display contrast, the material of the light-blocking layer 220 is, for example, a black resin material or other suitable light-absorbing materials. That is, by providing the light-blocking layer 220 having a light-absorbing effect, the display quality of the display apparatus 10 may be effectively improved. However, the invention is not limited thereto. According to other embodiments, the material of the light-blocking layer 220 may also include a light reflective material (for example, a metal material with high reflectivity or a white reflective material). In an embodiment not shown, the light-blocking layer may also be implemented by covering the photoresist pattern with a metal film layer.

Moreover, the adhesive layer 230 is disposed between the circuit layer 210 and the color-mixing layer 240, and covers a portion of the surface of the circuit layer 210, the plurality of micro light-emitting devices LED, and the light-blocking layer 220. The material of the adhesive layer 230 includes optical clear adhesive (OCA), optical clear resin (OCR), or other suitable optical grade adhesive materials. The color-mixing layer 240 is formed by a transparent material, such as glass, sapphire, or epoxy resin, and the thickness of the color-mixing layer 240 is greater than 100 microns. Here, the color-mixing layer 240 with a greater thickness may be regarded as a light-guiding layer to uniformly mix the light (such as red light, green light, and blue light) emitted by the plurality of micro light-emitting devices LED located in the same pixel area P to help improve the uniformity of light emission of each of the pixel areas P.

In particular, the light-emitting units 200 are transposed on the driving circuit board 100 after the fabrication is completed, and are electrically bonded to the plurality of conductive bumps 110 on the driving circuit board 100. However, because extremely high precision is needed in the transferring process, the driving circuit board 100 may not be aligned with 100% precision after the transposition. Therefore, there are gaps G between the plurality of light-emitting units 200 electrically bonded onto the driving circuit board 100. When the gaps G are irradiated by external ambient light, the light is likely to be (diffusely) reflected on the sidewalls of the light-emitting units 200 defining the gaps G and the surface 100s of the driving circuit board 100 and seen by human eyes. In other words, the presence of the gaps G makes the display images of the light-emitting units 200 likely to seem visually discontinuous.

In order to solve the issue above, the display apparatus 10 further includes a light-shielding layer 300 sandwiched between the plurality of light-emitting units 200. The material of the light-shielding layer 300 is, for example, a black resin material or other suitable light-absorbing materials. By providing the light-shielding layer 300 with light-absorbing characteristics at the gaps G of the light-emitting units 200, the visibility of the gaps G under external ambient light irradiation may be effectively reduced. In other words, the visual discontinuity caused by the gaps G to the display images of the light-emitting units 200 may be effectively alleviated, thereby improving the display quality of the display apparatus 10. In the present embodiment, the optical density (OD) of the light-shielding layer 300 may be greater than 2 to achieve a better light-absorbing effect, but is not limited thereto.

It should be mentioned that, in the present embodiment, the optical density of the light-blocking layer 220 of the light-emitting units 200 may be greater than or equal to the optical density of the light-shielding layer 300 to reduce the overall reflectivity of the circuit layer 210 of the light-emitting units 200 to external ambient light, so as to help improve the dark state performance (for example, dark state contrast) of the display apparatus 10, but the invention is not limited thereto. For example, in other embodiments, the materials of the light-shielding layer 300 and the light-blocking layer 220 may be optionally the same to increase the flexibility of material selection of the light-shielding layer 300.

Moreover, the light-shielding layer 300 and the light-blocking layer 220 of the light-emitting units 200 respectively have a top surface 300s and a top surface 220s away from the driving circuit board 100. The top surface 300s of the light-shielding layer 300 and the top surface 220s of the light-blocking layer 220 respectively have a first height H1 and a second height H2 relative to the surface 100s of the driving circuit board 100. In order to improve the light extraction efficiency and the light concentration of each of the light-emitting units 200, the first height H1 of the light-shielding layer 300 may be greater than the second height H2 of the light-blocking layer 220 of the light-emitting units 200, but is not limited thereto.

The method of fabricating the display apparatus 10 is exemplified below. First, the driving circuit board 100 is provided, and a transferring step is performed to transpose and electrically bond the plurality of light-emitting units 200 onto the plurality of conductive bumps 110 of the driving circuit board 100, as shown in FIG. 3A. For example, in the present embodiment, the plurality of light-emitting units 200 may be extracted using a temporary carrier CS without wiring, and the arrangement of the light-emitting units 200 on the carrier CS corresponds to the distribution state of the conductive bumps 110 on the driving circuit board 100 (i.e., the target substrate). The transferring step here may include one or a plurality of extractions and transpositions of the desired number of the light-emitting units 200.

Referring to FIG. 3B, after the transferring step of the light-emitting units 200 is completed, a light-shielding material layer 300M is formed on the driving circuit board 100. The light-shielding material layer 300M covers the light-emitting units 200 and a portion of the surface 100s of the driving circuit board 100. It is particularly noted that the light-shielding material layer 300M is filled in the gaps G between the light-emitting units 200 and the cavities between the light-emitting units 200 and the driving circuit board 100. Next, a lithography step is performed on the light-shielding material layer 300M to form the light-shielding layer 300 of FIG. 2. For example, the lithography step here may include forming a photoresist layer PR on the light-shielding material layer 300M, and performing exposure (as shown in FIG. 3C), development, and etching on the photoresist layer PR using a photomask MK, wherein the photomask MK has a plurality of openings MKa, and the photoresist layer PR material is, for example, a negative photoresist. Therefore, the openings MKa of the photomask MK may define the light-shielding layer 300 of FIG. 2. However, the invention is not limited thereto. In other embodiments, the material of the photoresist layer PR may also be a positive photoresist, but the configuration of the plurality of openings of the photomask MK needs to be adjusted accordingly.

It is worth noting that the light-shielding material layer 300M of the present embodiment is formed after the transferring step of the plurality of light-emitting units 200 is completed, but the invention is not limited thereto. In other embodiments, a light-shielding material layer 300P may also be formed before the transferring step of the plurality of light-emitting units 200 is performed, as shown in FIG. 4A. It should be mentioned that, the light-shielding material layer 300P is not overlapped with a plurality of conductive bumps 110A in the normal direction (for example, a direction Z) of the surface 100s of the driving circuit board 100, and is located between two conductive bumps 110A respectively corresponding to any two adjacent light-emitting units 200. Referring to FIG. 4B and FIG. 4C, during the transposition of the plurality of light-emitting units 200, the light-shielding material layer 300P is compressed by the light-emitting units 200 and flows into the gaps G between the light-emitting units 200. After the transferring step of the light-emitting units 200 is completed, a curing step is performed on the light-shielding material layer 300P deformed by compression to form a light-shielding layer 300A of a display apparatus 10A. The curing step here is, for example, using a UV light source to irradiate the light-shielding material layer 300P (as shown in FIG. 4C), but is not limited thereto. In other embodiments, the curing step may also be heating the light-shielding material layer 300P. From another perspective, by forming the light-shielding material layer 300P on the surface 100s of the driving circuit board 100 before the transferring step, two conductive bumps 110A respectively corresponding to any two adjacent light-emitting units 200 may be prevented from overflowing due to being compressed by the light-emitting units 200 during the transferring process and causing electrical short circuit between each other. In other words, the transposition yield of the light-emitting units 200 may also be increased.

That is, the step of forming the light-shielding layer may start before or after the step of transposing the plurality of light-emitting units 200. More specifically, the forming of the light-shielding material layer may be before or after the transferring step of the plurality of light-emitting units 200. Accordingly, the process flexibility of the light-shielding layer of the display apparatus may be increased.

In the following, other embodiments are provided to explain the disclosure in detail. The same components are labeled with the same reference numerals, and the description of the same technical content is omitted. For the omitted parts, please refer to the above embodiments, which are not repeated herein.

Figure 5:
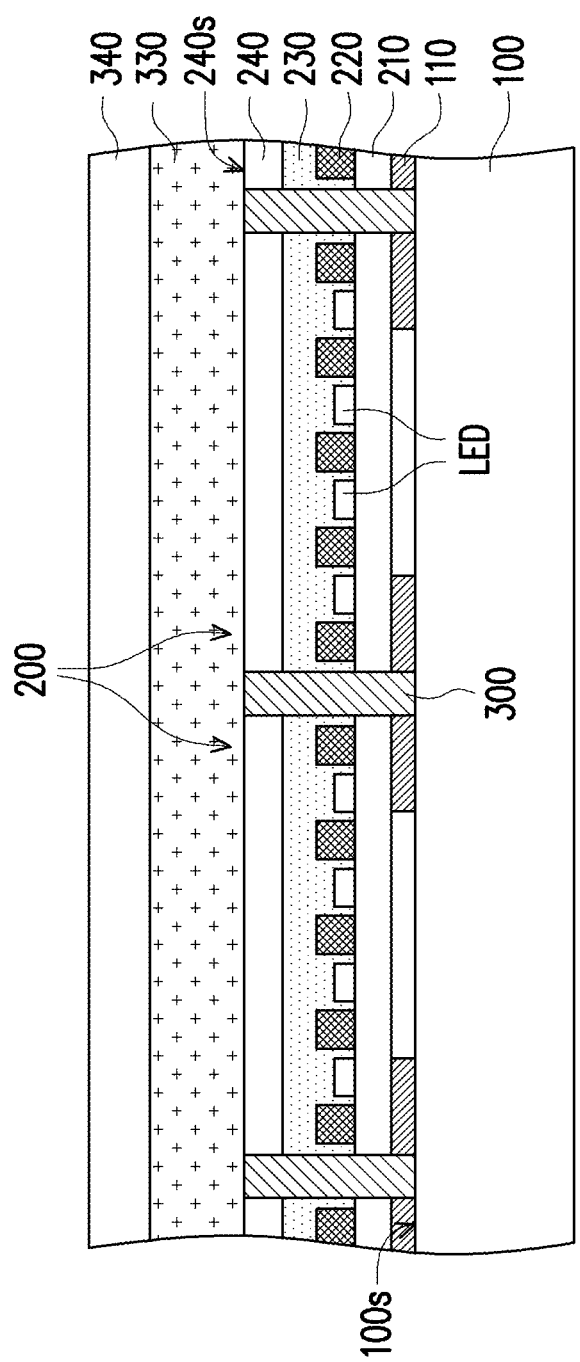
FIG. 5 is a cross-sectional view of a display apparatus of the second embodiment of the invention.
Figure 6A:
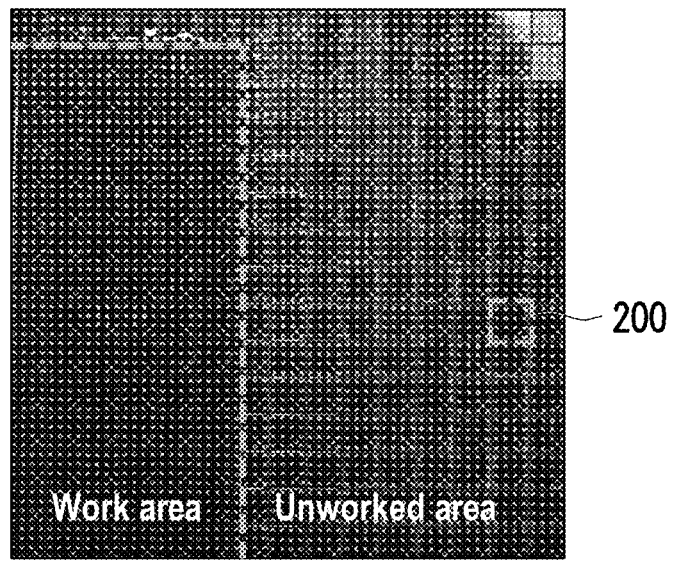
FIG. 6A is a top view of a display apparatus of another modified embodiment of FIG. 5 and a display apparatus of a comparative example.
Figure 6B:
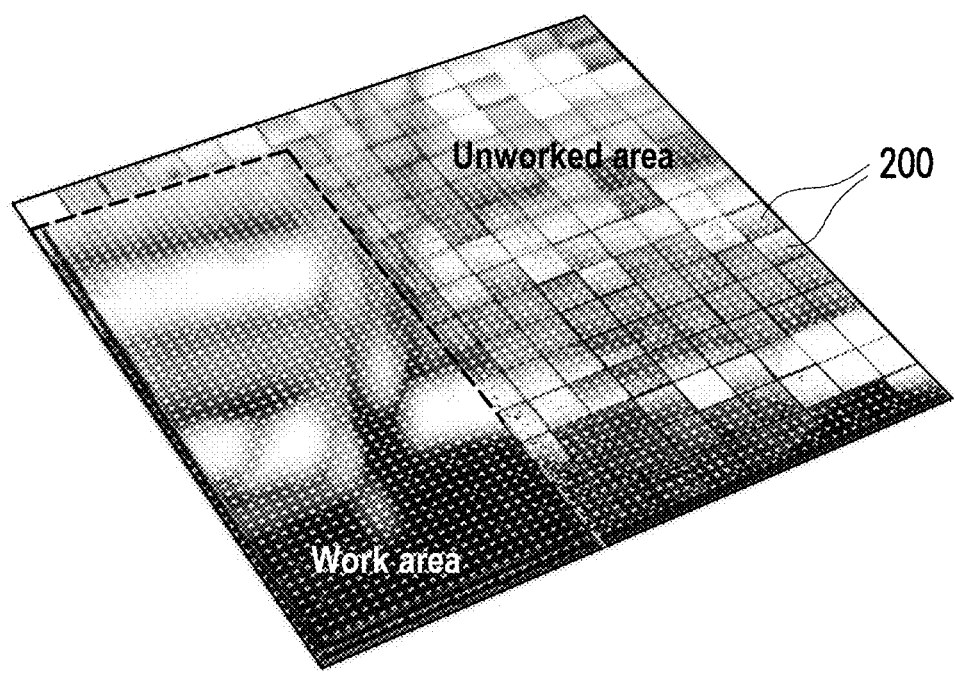
FIG. 6B is an oblique view of a display apparatus of another modified embodiment of FIG. 5 and a display apparatus of a comparative example.
Figure 6C:
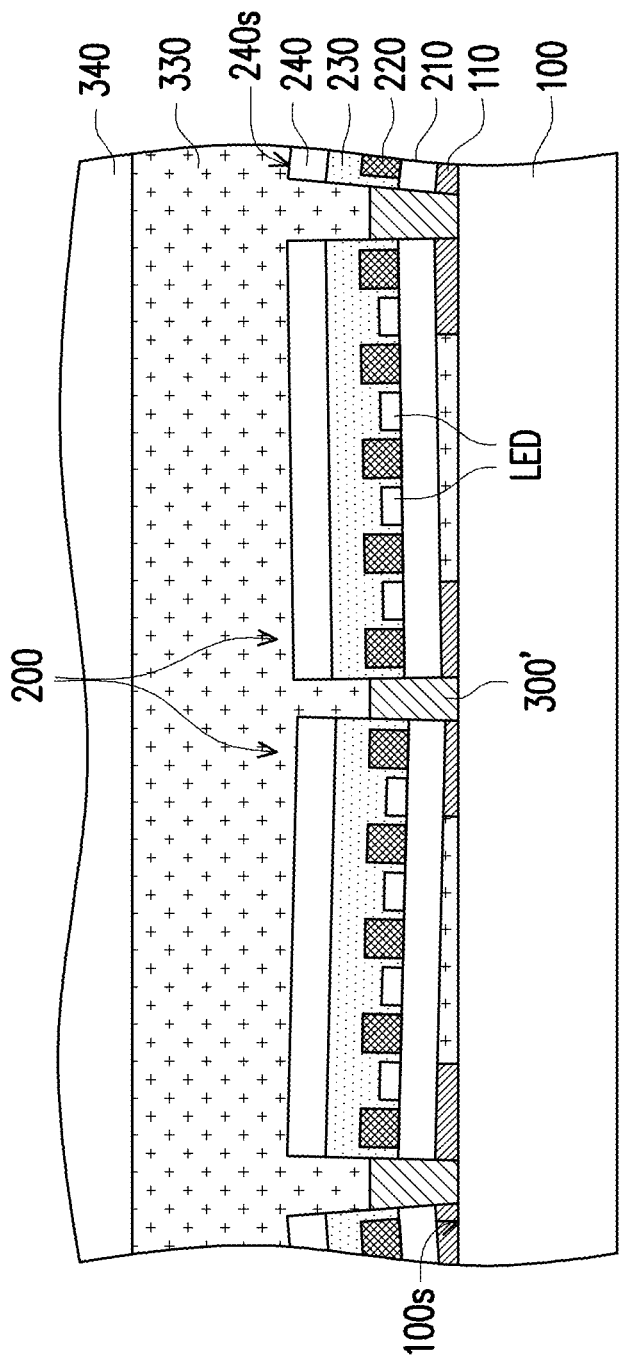
FIG. 6C is a cross-sectional view of a display apparatus of another modified embodiment of FIG. 5.

FIG. 5 is a cross-sectional view of a display apparatus of the second embodiment of the invention. FIG. 6A is a top view of a display apparatus of another modified embodiment of FIG. 5 and a display apparatus of a comparative example. FIG. 6B is an oblique view of a display apparatus of another modified embodiment of FIG. 5 and the display apparatus of a comparative example. FIG. 6C is a cross-sectional view of the display apparatus of another modified embodiment of FIG. 5. Please refer to FIG. 5, the difference between a display apparatus 11 of the present embodiment and the display apparatus 10 of FIG. 2 is that the display apparatus 11 further includes a protective layer 330 and a cover plate 340. The protective layer 330 covers the plurality of light-emitting units 200 and the light-shielding layer 300. The cover plate 340 is disposed on the protective layer 330 and overlapped with the light-emitting units 200 and the light-shielding layer 300. That is, in the present embodiment, the method of fabricating the display apparatus 11 further includes forming the protective layer 330 on the plurality of light-emitting units 200 and attaching the cover plate 340 onto the protective layer 330.

In the present embodiment, the Young's modulus of the light-shielding layer 300 is less than the Young's modulus of the protective layer 330, and the Young's modulus of the protective layer 330 is less than the Young's modulus of the cover plate 340. The light-shielding layer 300 with a Young's modulus less than the protective layer 330 may be used as a buffer between the light-emitting units 200, and the cover plate 340 with the largest Young's modulus may protect the light-emitting units 200. The material of the protective layer 330 includes optical clear adhesive (OCA), optical clear resin (OCR), or other suitable optical grade adhesive materials. The cover plate 340 is formed by a transparent material, such as glass, sapphire, or epoxy resin.

Moreover, the refractive index of the protective layer 330 may be similar to the refractive index of the adhesive layer 230 of the light-emitting units 200 and the refractive index of the color-mixing layer 240. For example, the refractive index difference between the protective layer 330, the adhesive layer 230, and the color-mixing layer 240 may be less than or equal to 1 and greater than or equal to 0. Accordingly, the reflection of light at the interface between the protective layer 330 and the color-mixing layer 240 and the interface between the protective layer 330 and the adhesive layer 230 may be effectively suppressed, thereby improving the edge visibility and consistency of each of the light-emitting units 200. FIG. 6A and FIG. 6B show the appearance quality of a display apparatus 11A of another modified embodiment of FIG. 5 and a comparative example under the irradiation of external ambient light. As shown in FIG. 6A, by providing the protective layer 330, the edge visibility and consistency of each of the light-emitting units 200 may be significantly improved.

Referring to FIG. 6A to FIG. 6C, it should be noted that due to variations in the transferring process or slight differences in the structure of the plurality of light-emitting units 200, the flatness of each of the light-emitting units 200 transposed on the driving circuit board 100 is different (as shown in FIG. 6C). Therefore, a mosaic-like appearance may be readily seen when viewing the display apparatus from an oblique viewing angle (as shown in the unworked area in FIG. 6B). The flatness here is, for example, how parallel a surface 240s of the color-mixing layer 240 of the light-emitting units 200 (as shown in FIG. 6C) and the surface 100s of the driving circuit board 100 are. As shown in the work area of FIG. 6B, covering the transposed light-emitting units 200 using the protective layer 330 with a refractive index similar to that of the color-mixing layer 240 and the adhesive layer 230 may also significantly alleviate the mosaic phenomenon. Since the configuration and function of a light-shielding layer 300' here are similar to the above embodiments, for detailed description, please refer to the relevant paragraphs of the above embodiments, which is not repeated herein.

Figure 7:
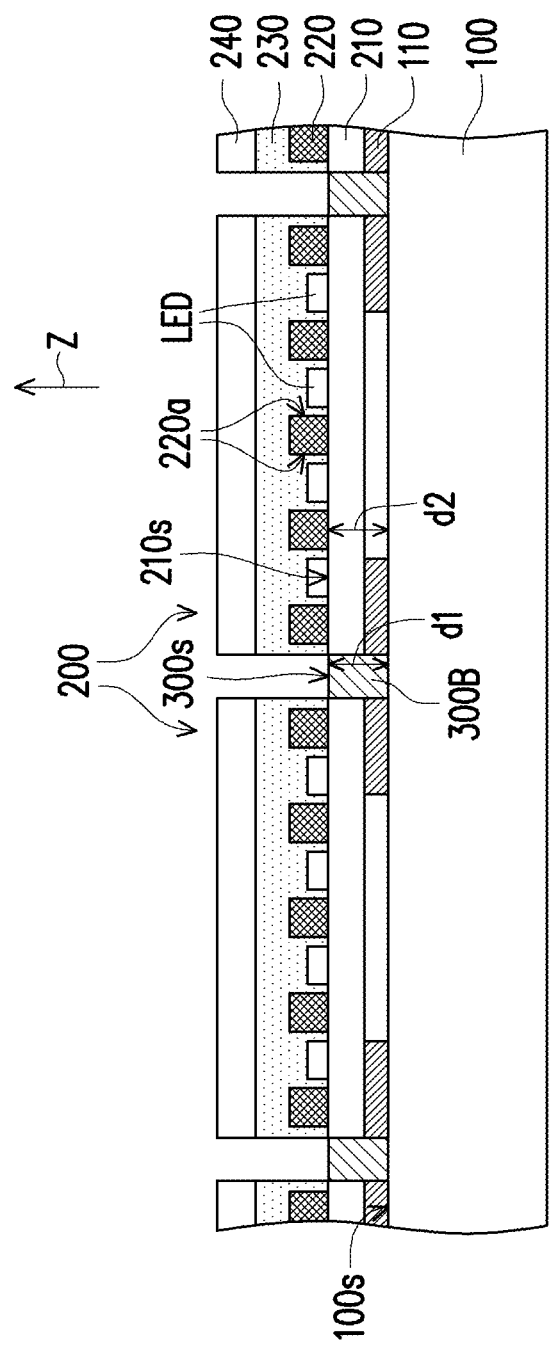
FIG. 7 is a cross-sectional view of a display apparatus of the third embodiment of the invention.

FIG. 7 is a cross-sectional view of a display apparatus of the third embodiment of the invention. Please refer to FIG. 7, the difference between a display apparatus 12 of the present embodiment and the display apparatus 10 of FIG. 2 is that the height of the light-shielding layer is different. In the present embodiment, the top surface 300s of a light-shielding layer 300B may be optionally aligned with the surface 210s of the circuit layer 210 of the light-emitting units 200. Accordingly, a buffer space needed for the thermal expansion of the light-emitting units 200 due to the heating of the driving circuit board 100 in a subsequent fabricating process may be provided. However, the invention is not limited thereto. According to other embodiments, the ratio of a first distance d1 between the top surface 300s of the light-shielding layer 300 and the surface 100s of the driving circuit board 100 to a second distance d2 between the surface 210s of the circuit layer 210 and the top surface 300s of the light-shielding layer 300 may be between 0.9 and 1.1.

Figure 8:
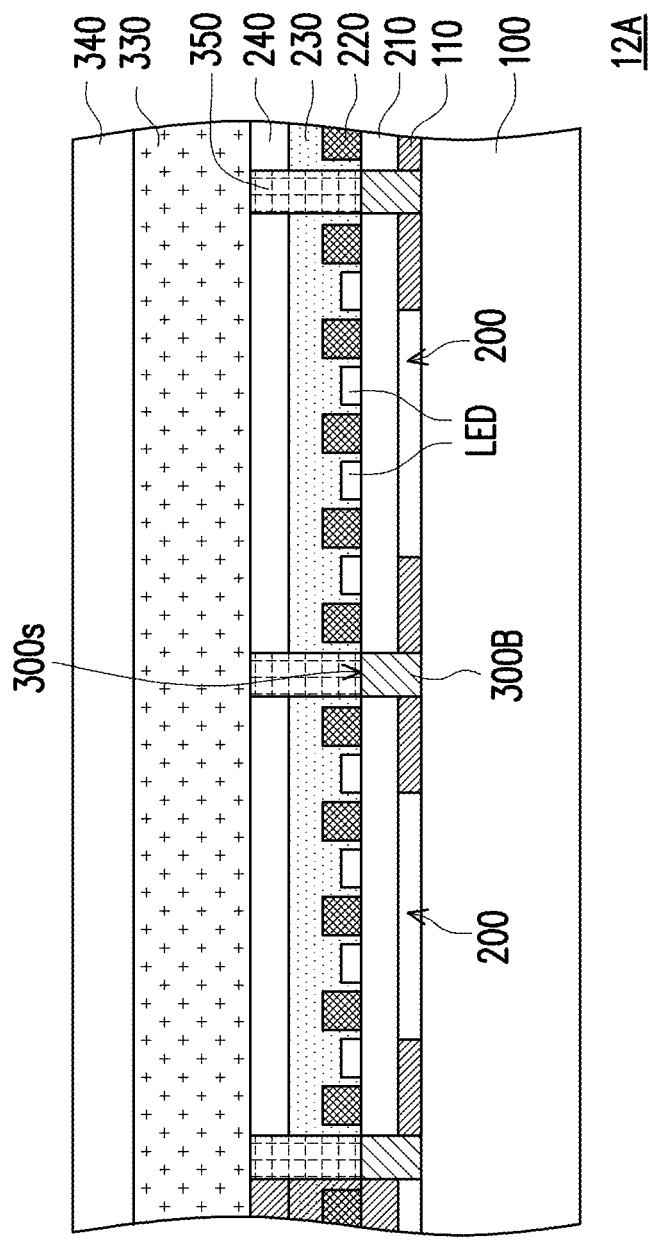
FIG. 8 is a cross-sectional view of a display apparatus of the fourth embodiment of the invention.

FIG. 8 is a cross-sectional view of a display apparatus of the fourth embodiment of the invention. Please refer to FIG. 8, the difference between a display apparatus 12A of the present embodiment and the display apparatus 12 of FIG. 7 is that the display apparatus 12A may optionally include the protective layer 330, the cover plate 340, and a light-guiding layer 350. Since the protective layer 330 and the cover plate 340 have functions in the display apparatus 12A similar to the display apparatus 11 of FIG. 5, for detailed description, please refer to the relevant paragraphs of the above embodiments, which is not repeated herein. The light-guiding layer 350 is sandwiched between the plurality of light-emitting units 200 and disposed on the light-shielding layer 300B.

In the present embodiment, the top surface 300s of the light-shielding layer 300B may be optionally aligned with the surface 210s of the circuit layer 210 of the light-emitting units 200. Therefore, the adhesive layer 230 and the color-mixing layer 240 of the light-emitting units 200 define the sidewalls of the gaps G and are not covered by the light-shielding layer 300B, but are covered by the light-guiding layer 350. In the present embodiment, the light-guiding layer 350 is used to guide light. For example, the external light entering the gaps G may be transmitted to the light-shielding layer 300B via the light-guiding layer 350 to be absorbed. Moreover, the image light emitted by the light-emitting units 200 may be guided by the light-guiding layer 350 to exit the direction away from the driving circuit board 100 after entering the gaps G. Accordingly, the visibility of the gaps G between the plurality of light-emitting units 200 may be further reduced.

Moreover, the light-guiding layer 350 also has the effect of completely filling the gaps G between the light-emitting units 200. Therefore, in the subsequent fabricating process, the protective layer 330 with a more uniform film surface may be formed, and the accumulation of bubbles produced at the interface of the protective layer 330 and the cover plate 340 when the cover plate 340 is attached to the protective layer 330 is avoided. In other words, the yield of subsequent processes may be effectively improved. In the present embodiment, the materials of the light-guiding layer 350 and the protective layer 330 may optionally be different, and the light transmittance of the light-guiding layer 350 is less than the light transmittance of the protective layer 330, but the invention is not limited thereto. According to other embodiments, the materials of the light-guiding layer 350 and the protective layer 330 may also be the same.

Figure 9:
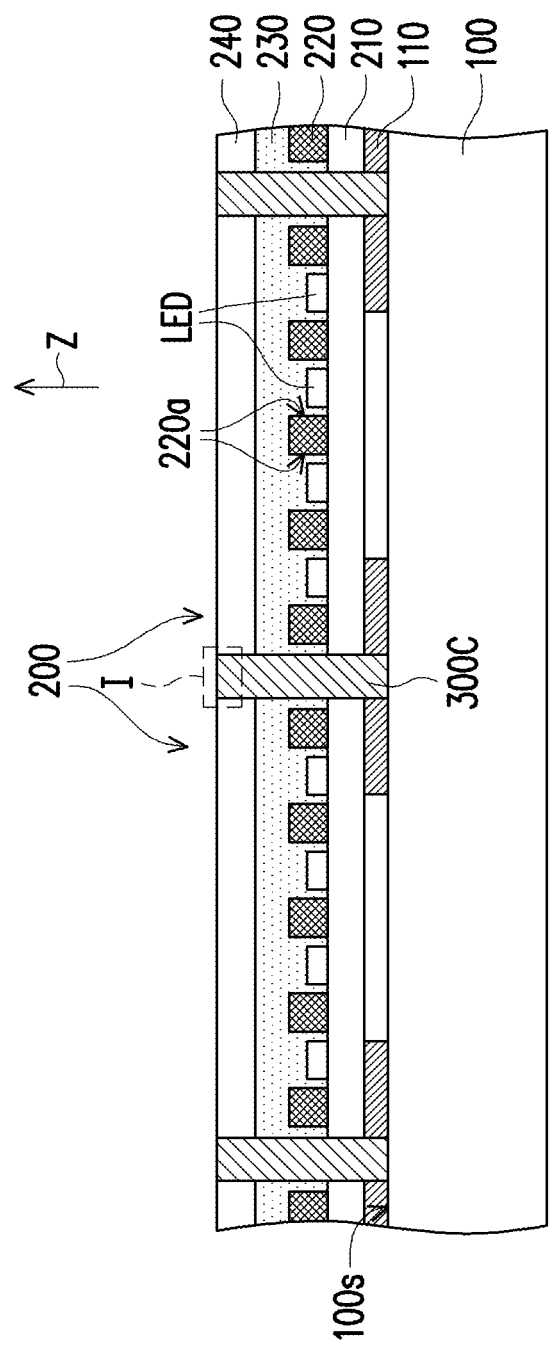
FIG. 9 is a cross-sectional view of a display apparatus of the fifth embodiment of the invention.
Figure 10:
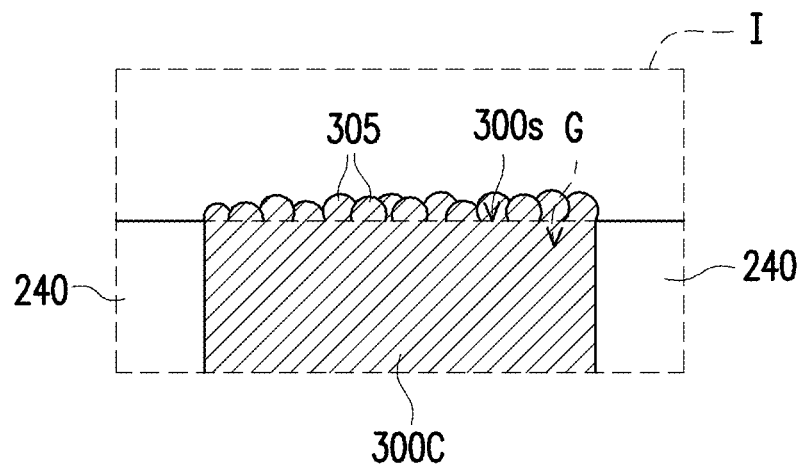
FIG. 10 is a partial enlarged view of the display apparatus of FIG. 9.
Figure 11:
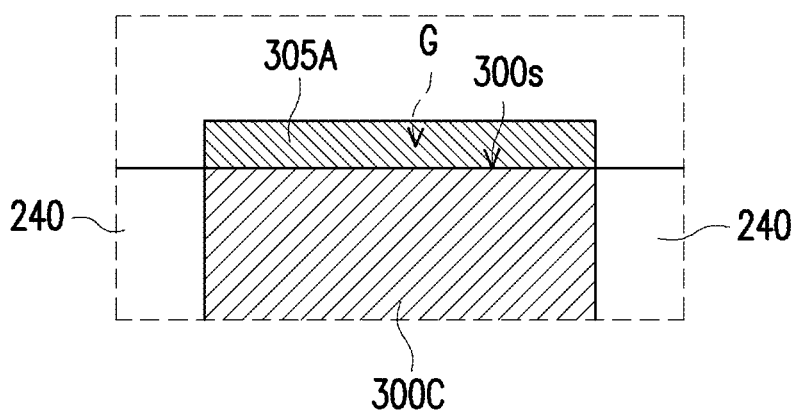
FIG. 11 is a cross-sectional view of another modified embodiment of a display apparatus of FIG. 10.

FIG. 9 is a cross-sectional view of a display apparatus of the fifth embodiment of the invention. FIG. 10 is a partial enlarged view of the display apparatus of FIG. 9. FIG. 10 corresponds to an area I of FIG. 9. FIG. 11 is a cross-sectional view of another modified embodiment of the display apparatus of FIG. 10. Referring to FIG. 9 and FIG. 10, the difference between a display apparatus 13 of the present embodiment and the display apparatus 10 of FIG. 2 is that an optical structure 305 is provided on the top surface 300s of a light-shielding layer 300C of the display apparatus 13 away from the driving circuit board 100. In the present embodiment, the optical structure 305 is, for example, a plurality of optical microstructures formed on the top surface 300s of the light-shielding layer 300C, and the optical microstructures may increase the roughness of the light-shielding layer 300C at a side of the top surface 300s. Accordingly, the scattering effect of the light-shielding layer 300C for external light may be effectively increased, thereby reducing the visibility and improving the consistency of the gaps G between the plurality of light-emitting units 200. However, the invention is not limited thereto, and in other embodiments, the optical structure 305A may also be an absorption-type polarizing film (for example, a polarizer), as shown in FIG. 11.

Figure 12:
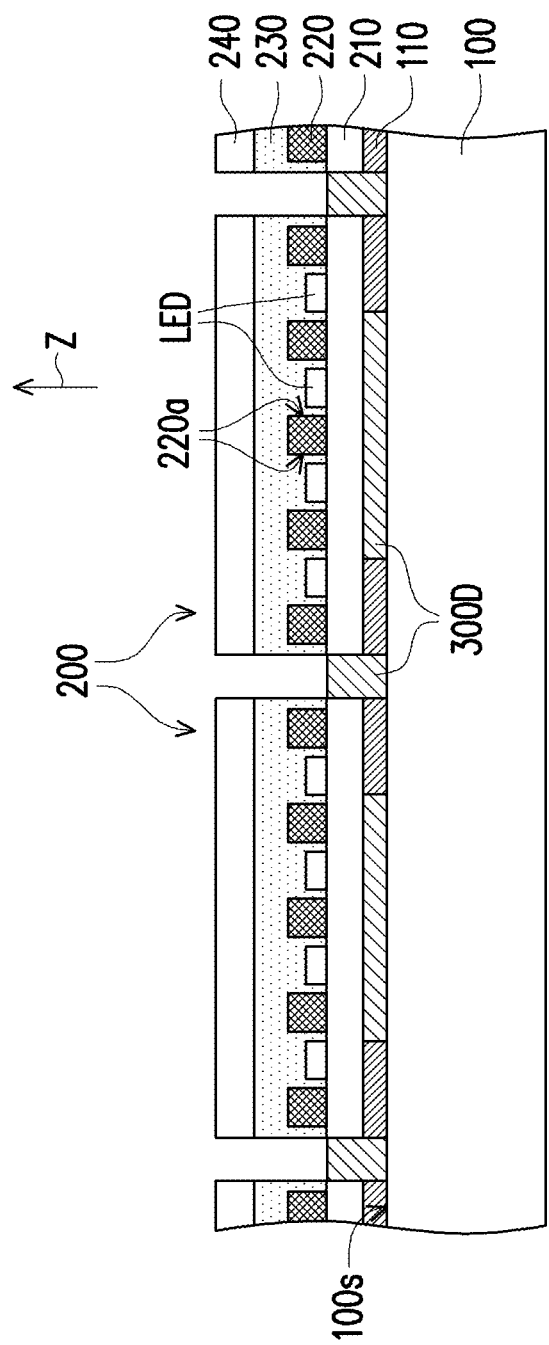
FIG. 12 is a cross-sectional view of a display apparatus of the sixth embodiment of the invention.

FIG. 12 is a cross-sectional view of a display apparatus of the sixth embodiment of the invention. Referring to FIG. 12, the difference between a display apparatus 14 of the present embodiment and the display apparatus 12 of FIG. 7 is a light-shielding layer 300D of the display apparatus 14 is further extends between the circuit layer 210 of each of the light-emitting units 200 and the driving circuit board 100 to absorb unexpected light (i.e., stray light) emitted from the light-emitting units 200 toward the driving circuit board 100.

Figure 13:
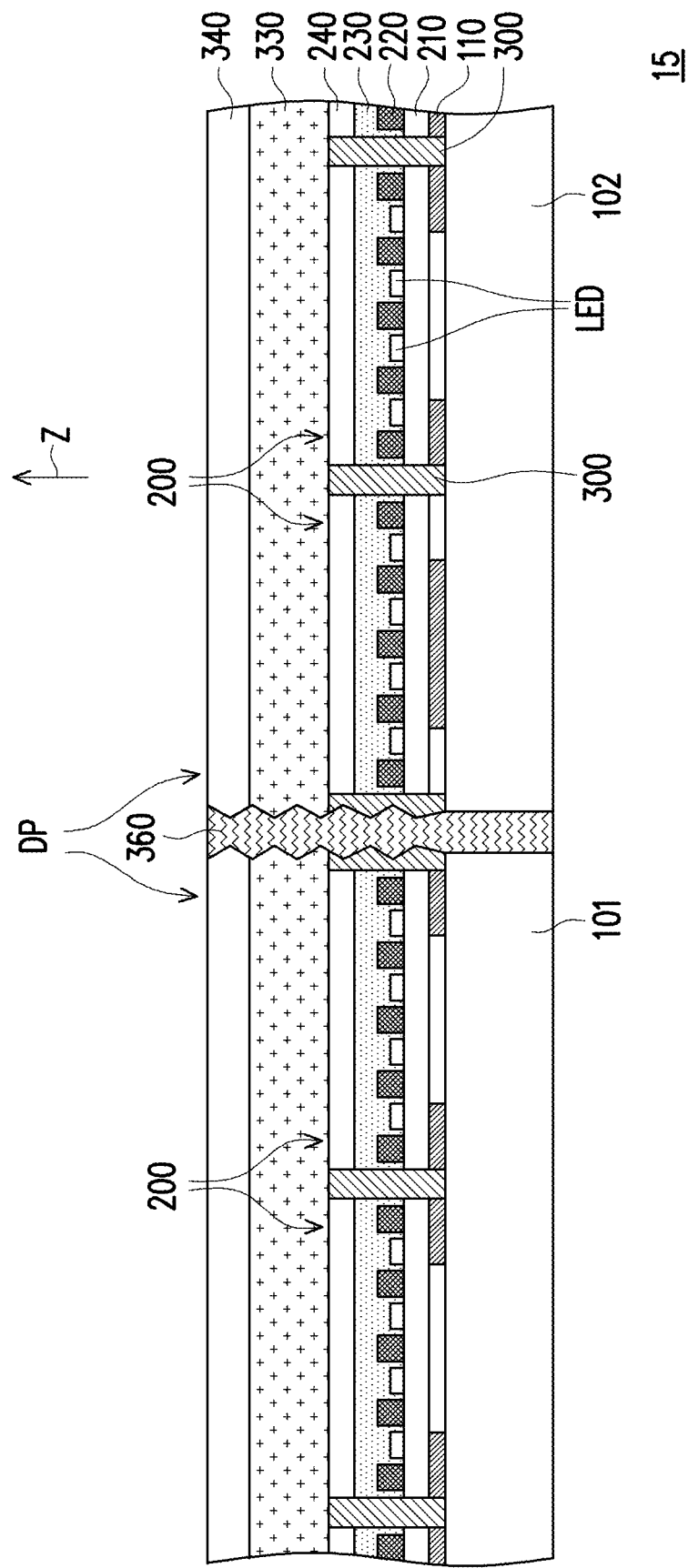
FIG. 13 is a cross-sectional view of a display apparatus of the seventh embodiment of the invention.

FIG. 13 is a cross-sectional view of a display apparatus of the seventh embodiment of the invention. Please refer to FIG. 13, the main difference between a display apparatus 15 of the present embodiment and the display apparatus 11 of FIG. 5 is that the number of the driving circuit board is different. Specifically, the display apparatus 15 is formed by tiling a plurality of driving circuit boards (for example, a first driving circuit board 101 and a second driving circuit board 102). The display size and the outline of such a display apparatus may be adjusted according to different usage scenarios to help increase the operating flexibility of the display apparatus. Since the configuration relationship between the driving circuit board and the plurality of light-emitting units 200 of the present embodiment is similar to that of the display apparatus 11 of FIG. 5, for the detailed description, please refer to the relevant paragraphs of the above embodiments, which is not repeated herein.

For example, in the method of fabricating the display apparatus 15, a cutting step also needs to be performed for a plurality of display panels DP formed after the plurality of light-emitting units 200 are transposed on each of the driving circuit boards to meet different tiling design requirements. Therefore, the sidewalls of each of the display panels for tiling have worse surface flatness, causing the tiling gaps of the display panels to be readily visible in the line of sight direction (for example, the reverse of the direction Z). To solve this issue, a light-absorbing layer 360 is further provided between the display panels DP (or a plurality of driving circuit boards) of the display apparatus 15, and the optical density of the light-absorbing layer 360 is less than or equal to the optical density of the light-blocking layer 220. In the present embodiment, the optical density of the light-absorbing layer 360 may be similar to the optical density of the light-shielding layer 300, but is not limited thereto. The light-absorbing layer 360 may also be the same as the light-blocking layer 220.

Moreover, in the present embodiment, the light-absorbing layer 360 may comprehensively cover the tiled surfaces of the display panels DP, but the invention is not limited thereto. In other embodiments, the light-absorbing layer may also partially cover the sidewall surfaces of the display panels for tiling, and the flatness of the sidewall surfaces is better (that is, the display panels are not cut before tiling).

Figure 14:
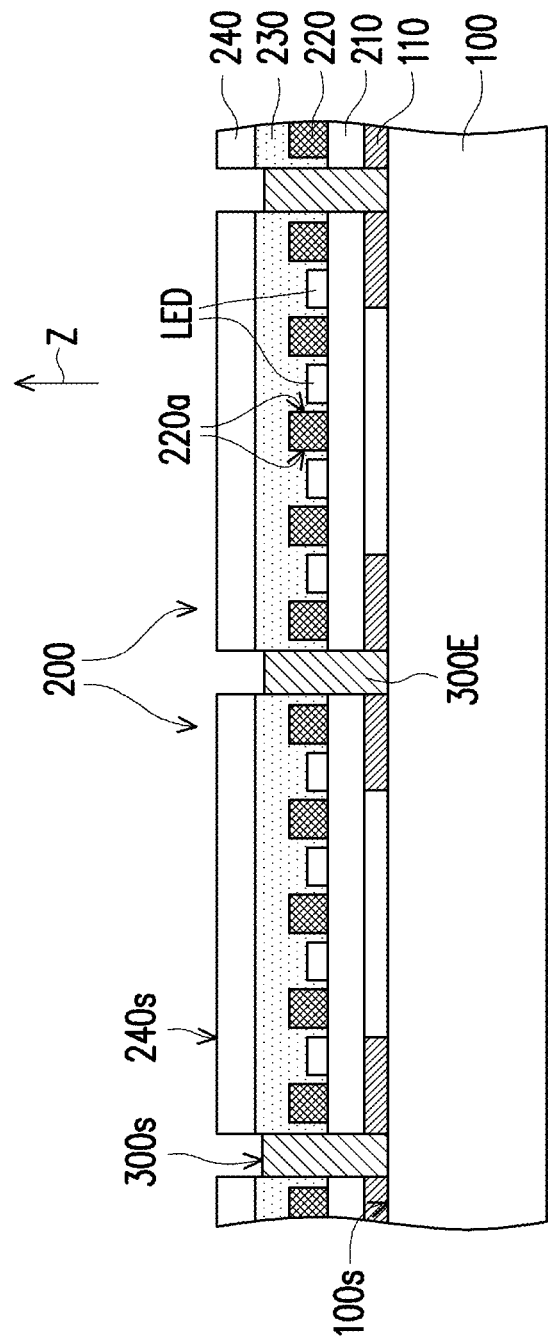
FIG. 14 is a cross-sectional view of a display apparatus of the eighth embodiment of the invention.

FIG. 14 is a cross-sectional view of a display apparatus of the eighth embodiment of the invention. Please refer to FIG. 14, the difference between a display apparatus 16 of the present embodiment and the display apparatus 10 of FIG. 2 is that a light-shielding layer 300E of the display apparatus 16 has elasticity. At this time, the Young's modulus of the light-shielding layer 300E may be less than that of the adhesive layer 230. In the present embodiment, the top surface 300s of the light-shielding layer 300E may not be aligned with the surface 240s of the color-mixing layer 240 of the light-emitting units 200. When the display apparatus 16 of the present embodiment is a flexible and bendable display apparatus, the light-emitting units 200 are disposed on the flexible driving circuit board 100, such as a flexible printed circuit (FPC) board. When the display apparatus 16 is bent, the light-shielding layer 300E having elasticity and a space formed between the light-shielding layer 300E and two adjacent light-emitting units 200 may be used as a buffer space between the plurality of light-emitting units 200 to prevent the light-emitting units 200 from colliding with each other and being damaged when the driving circuit board 100 is bent. In other embodiments, the top surface of the light-shielding layer may also be aligned with the surface of the color-mixing layer of the light-emitting units, but is not limited thereto.

Figure 15:
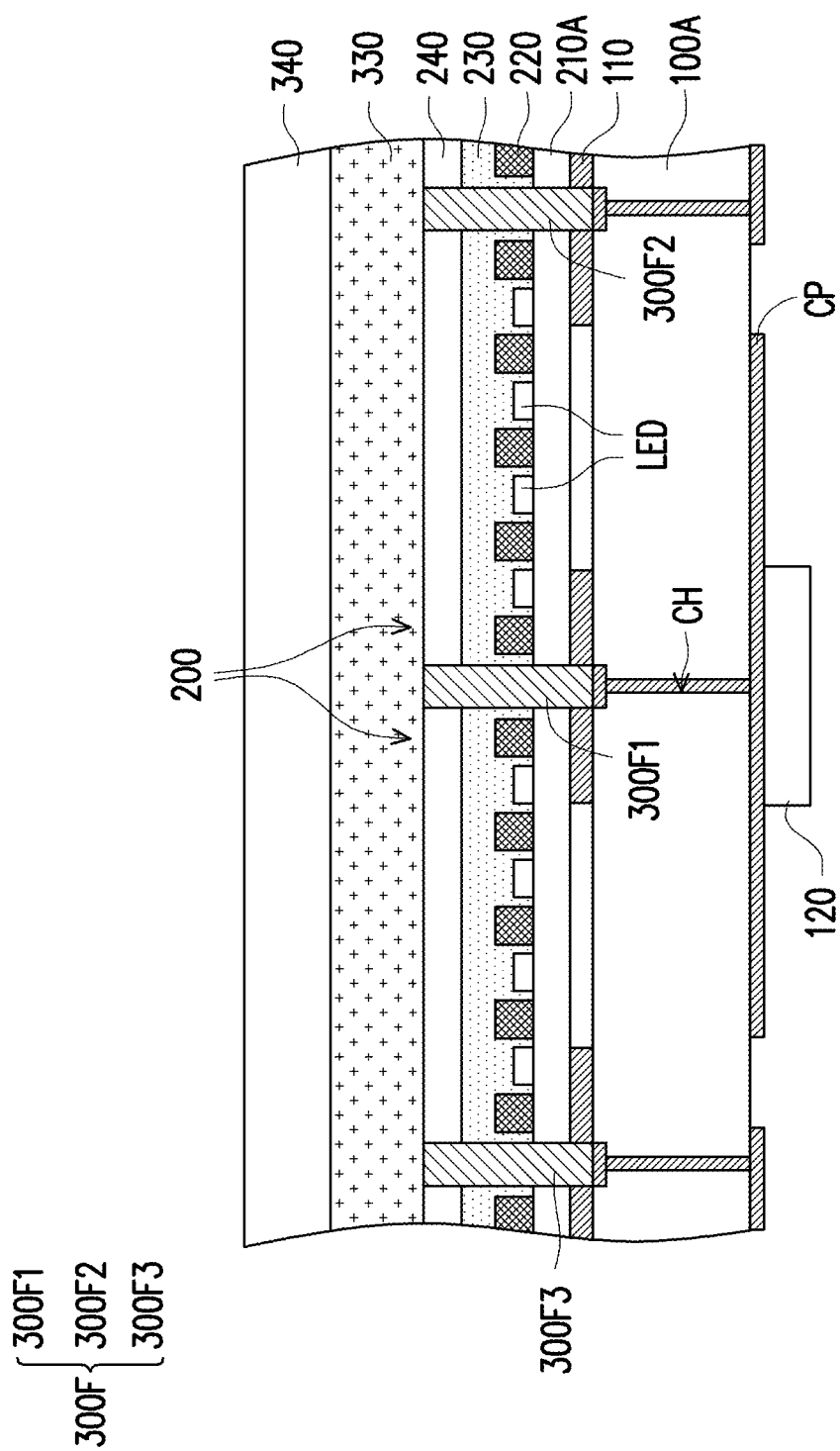
FIG. 15 is a cross-sectional view of a display apparatus of the ninth embodiment of the invention.
Figure 16:
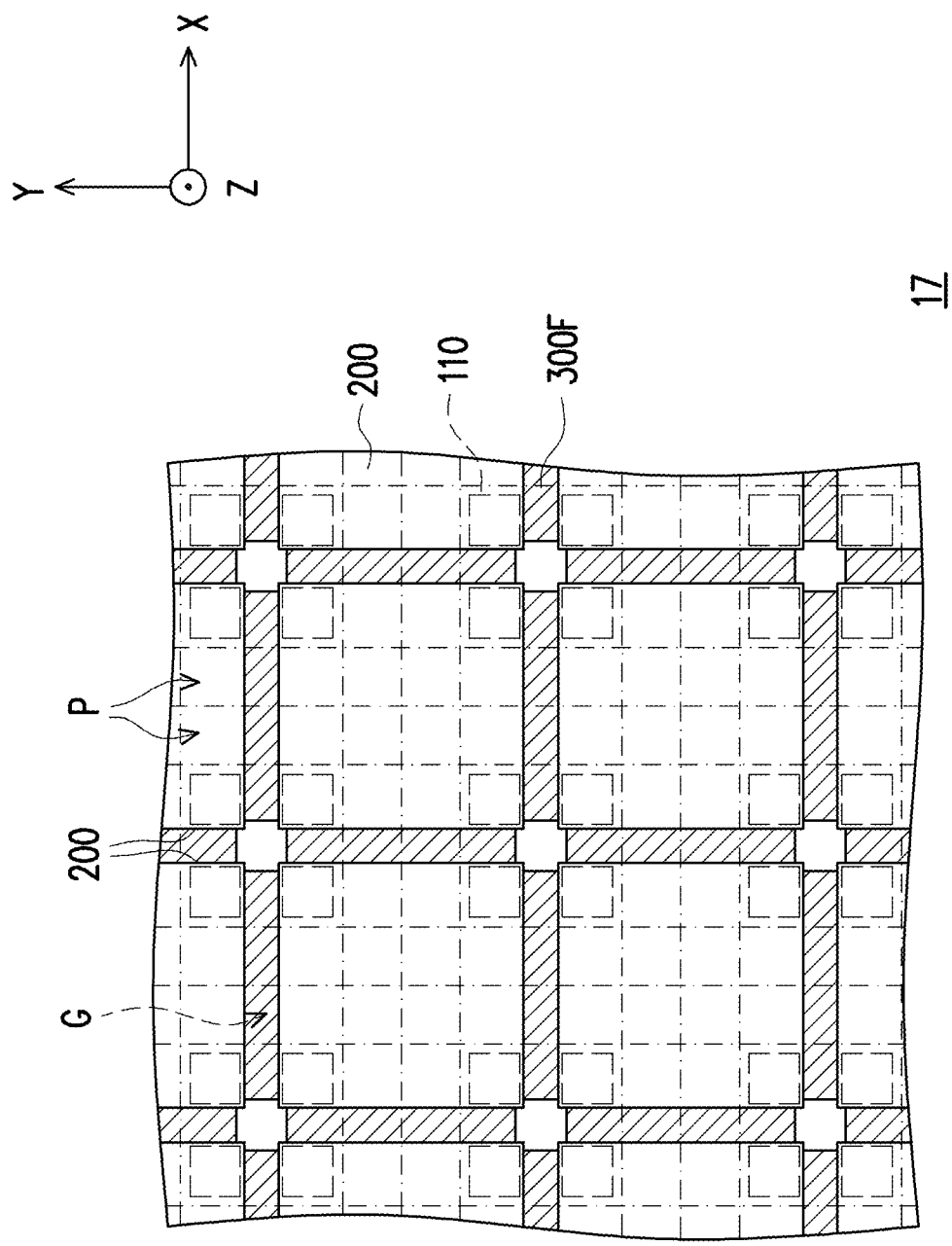
FIG. 16 is a top view of the display apparatus of FIG. 15.

FIG. 15 is a cross-sectional view of a display apparatus of the ninth embodiment of the invention. FIG. 16 is a top view of the display apparatus of FIG. 15. Please refer to FIG. 15. In the present embodiment, a light-shielding layer 300F of a display apparatus 17 has conductivity. For example, a driving circuit board 100A may have a plurality of conductive vias CH and a plurality of conductive patterns CP, the conductive bumps 110 are respectively electrically connected to the conductive patterns CP via the light-shielding layer 300F and the conductive vias CH, and the conductive patterns CP are used to electrically connect the driving chip 120, but are not limited thereto. In other embodiments, the driving chips 120 may also be embedded in the driving circuit board. It should be mentioned that, the plurality of micro light-emitting elements LED on the light-emitting units 200 are electrically connected to corresponding bonding pads BP on the driving circuit board 100A via the light-shielding layer 300F covering the sidewalls of the light-emitting units 200. Accordingly, the design of the circuit layer 210A of the light-emitting units 200 may be simplified (for example, the number of contact holes of the circuit layer 210A may be reduced, or even be zero), or the circuit design margin of the light-emitting units 200 is increased.

It should be understood that, since the light-shielding layer 300F of the present embodiment has conductivity, the light-shielding layer 300F is, for example, a plurality of electrically independent light-shielding patterns (for example, a light-shielding pattern 300F1, a light-shielding pattern 300F2, and a light-shielding pattern 300F3). In other words, the light-shielding patterns of the light-shielding layer 300F of the present embodiment are separately disposed (or disposed at intervals) around the light-emitting units 200 (as shown in FIG. 16) instead of the light-shielding layer 300 of the display apparatus 10 shown in FIG. 1 that is continuously disposed around the light-emitting units 200.

Figure 17:
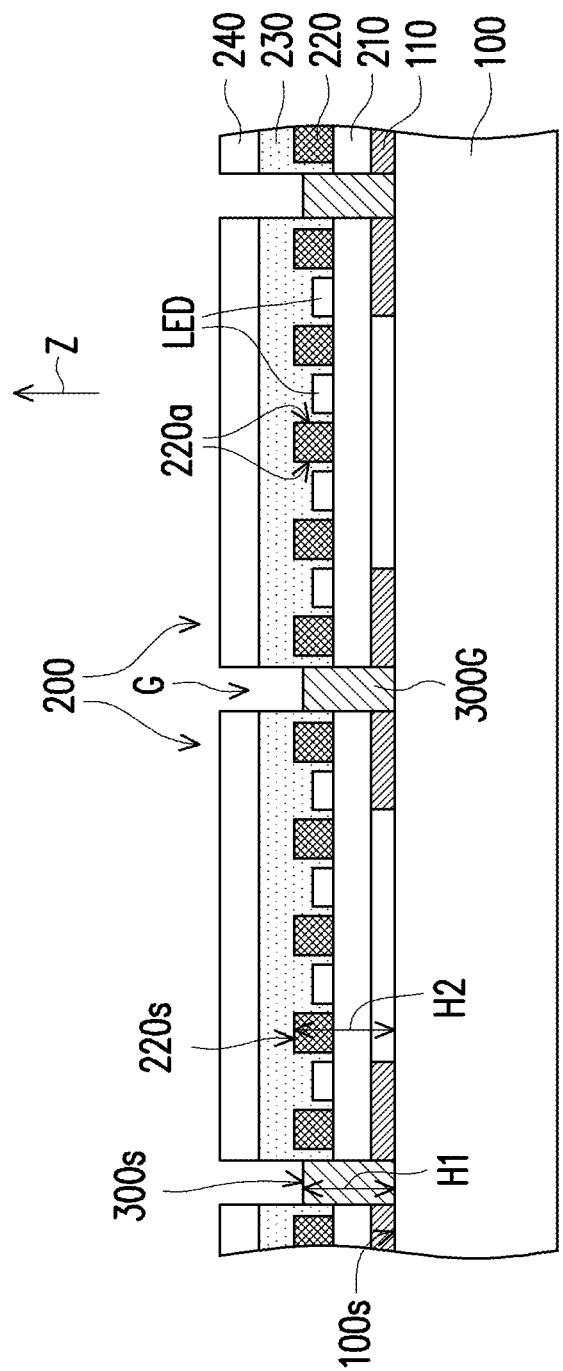
FIG. 17 is a cross-sectional view of a display apparatus of the tenth embodiment of the invention.

FIG. 17 is a cross-sectional view of a display apparatus of the tenth embodiment of the invention. Referring to FIG. 17, the difference between a display apparatus 18 of the present embodiment and the display apparatus 16 of FIG. 14 is that the first height H1 of the top surface 300s of a light-shielding layer 300G of the display apparatus 18 relative to the surface 100s of the driving circuit board 100 is less than the second height H2 of the top surface 220s of the light-blocking layer 220 relative to the surface 100s of the driving circuit board 100. Accordingly, in addition to increasing the buffer space between the light-emitting units 200, the light-shielding layer 300G may also be prevented from excessively blocking the side light emission between the light-emitting units 200.

Based on the above, in the display apparatus of an embodiment of the invention, a light-shielding layer is provided in the gaps between the plurality of light-emitting units electrically bonded to the at least one driving circuit board. The light-shielding layer is suitable for absorbing at least a portion of the light incident on the gaps, thereby improving the visibility and the consistency of the gaps under the illumination of external ambient light. In other words, the visual discontinuity caused by the gaps to the display images of the light-emitting units may be effectively alleviated, thereby improving the display quality of the display apparatus. In the method of fabricating the display apparatus of an embodiment of the invention, the step of forming the light-shielding layer may start before or after the transferring step of the plurality of light-emitting units, thus increasing the flexibility of the fabricating process of the light-shielding layer.

What is claimed is:

1. A display apparatus, comprising:
   at least one driving circuit board;
   a plurality of light-emitting units, disposed on a surface of the at least one driving circuit board, and respectively having a plurality of pixel areas, each of the light-emitting units comprising:
      a circuit layer, electrically bonded to one of the at least one driving circuit board;
      a plurality of micro light-emitting devices, disposed on a side of the circuit layer away from the at least one driving circuit board and electrically bonded to the circuit layer, wherein the micro light-emitting devices are respectively located in the pixel areas;
      a color-mixing layer, disposed on a side of the micro light-emitting devices away from the circuit layer; and
      an adhesive layer, disposed between the circuit layer and the color-mixing layer; and
   a light-shielding layer, disposed on the at least one driving circuit board and disposed between the light-emitting units.

2. The display apparatus of claim 1, wherein an optical density of the light-shielding layer is greater than 2.

3. The display apparatus of claim 1, wherein an optical structure is provided on a top surface of the light-shielding layer away from the at least one driving circuit board.

4. The display apparatus of claim 1, wherein the light-shielding layer further extends between the circuit layer of each of the light-emitting units and the at least one driving circuit board.

5. The display apparatus of claim 1, wherein the light-shielding layer has elasticity.

6. The display apparatus of claim 1, wherein the light-shielding layer has conductivity, and the circuit layer of each of the light-emitting units is electrically connected to the at least one driving circuit board via the light-shielding layer.

7. The display apparatus of claim 1, wherein each of the light-emitting units further comprises:
   a light-blocking layer, disposed on the circuit layer and having a plurality of openings, wherein the micro light-emitting devices are respectively disposed in the openings.

8. The display apparatus of claim 7, wherein the light-shielding layer and the light-blocking layer respectively have a first top surface and a second top surface away from the at least one driving circuit board, the first top surface and the second top surface respectively have a first height and a second height relative to the surface of the at least one driving circuit board, and the first height is greater than the second height.

9. The display apparatus of claim 7, wherein a ratio of a first distance between a first top surface of the light-shielding layer away from the at least one driving circuit board and the surface of the at least one driving circuit board to a second distance between a surface of the circuit layer away from the at least one driving circuit board and the surface of the at least one driving circuit board is between 0.9 and 1.1.

10. The display apparatus of claim 7, further comprising:
   a light-absorbing layer, wherein the at least one driving circuit board comprises a first driving circuit board and a second driving circuit board, the light-absorbing layer is disposed between the first driving circuit board and the second driving circuit board, and an optical density of the light-absorbing layer is less than or equal to an optical density of the light-blocking layer.

11. The display apparatus of claim 7, wherein an optical density of the light-blocking layer is greater than or equal to an optical density of the light-shielding layer.

12. The display apparatus of claim 11, wherein the light-shielding layer and the light-blocking layer are made of a same material.

13. The display apparatus of claim 1, further comprising:
   a protective layer, covering the light-emitting units and the light-shielding layer; and
   a cover plate, disposed on the protective layer and overlapped with the light-emitting units and the light-shielding layer.

14. The display apparatus of claim 13, wherein a Young's modulus of the light-shielding layer is less than a Young's modulus of the protective layer, and the Young's modulus of the protective layer is less than a Young's modulus of the cover plate.

15. The display apparatus of claim 13, wherein a refractive index difference of the protective layer, the color-mixing layer, and the adhesive layer is less than or equal to 1 and greater than or equal to 0.

16. The display apparatus of claim 13, further comprising:
 a light-guiding layer, sandwiched between the light-emitting units and disposed on the light-shielding layer.

17. The display apparatus of claim 16, wherein a transmittance of the light-guiding layer is less than a transmittance of the protective layer.

* * * * *